US006509688B1

United States Patent
Bae et al.

(10) Patent No.: US 6,509,688 B1
(45) Date of Patent: Jan. 21, 2003

(54) ELECTRO-LUMINESCENT DISPLAY WITH STORAGE CAPACITOR FORMED IN LONGITUDINAL DIRECTION OF POWER SUPPLY LINE

(75) Inventors: Sung Joon Bae, Kyounggi-Do (KR); Jae Yoon Lee, Seoul (KR); Jae Yong Park, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 172 days.

(21) Appl. No.: 09/612,595

(22) Filed: Jul. 7, 2000

(30) Foreign Application Priority Data

Jul. 8, 1999 (KR) .............................. 99-27493
Sep. 15, 1999 (KR) .............................. 99-39696

(51) Int. Cl.⁷ .............................. H01J 1/62; H01J 63/04
(52) U.S. Cl. ...................... 313/504; 313/506; 313/509; 315/169.3
(58) Field of Search ................. 313/504, 500, 313/505, 506, 509, 483; 315/169.3, 169.4

(56) References Cited

U.S. PATENT DOCUMENTS

| | | | | |
|---|---|---|---|---|
| 5,684,365 A | * | 11/1997 | Tang et al. | 315/169.3 |
| 6,046,547 A | * | 4/2000 | Nishio et al. | 315/169.3 |
| 6,057,647 A | * | 5/2000 | Kurosawa et al. | 315/169.3 |
| 6,072,450 A | * | 6/2000 | Yamada et al. | 345/76 |
| 6,175,345 B1 | * | 1/2001 | Kuribayashi et al. | 345/76 |
| 6,215,244 B1 | * | 4/2001 | Kuribayashi et al. | 313/505 |
| 6,369,507 B1 | * | 4/2002 | Arai | 313/506 |

* cited by examiner

Primary Examiner—Vip Patel
Assistant Examiner—Kevin Quarterman
(74) Attorney, Agent, or Firm—Birch, Stewart, Kolasch & Birch, LLP

(57) ABSTRACT

An electro-luminescence display that is capable of widening an effective display area of a pixel. In the electro-luminescence display, a data line is formed in a direction crossing a gate line. A power supply line is formed in a manner such that it is insulated from the gate line and the data line. A first switching device has a gate connected to the gate line and a source connected to the data line. A second switching device has a gate connected to a drain of the first switching device and a source connected to the power supply line. An electro-luminescence emitting part is connected to the drain of the second switching device. A storage capacitor is formed in a lengthwise direction of the power supply to charge a voltage applied to the gate of the second switching device.

15 Claims, 7 Drawing Sheets

ELECTRO-LUMINESCENT DISPLAY WITH STORAGE CAPACITOR FORMED IN LONGITUDINAL DIRECTION OF POWER SUPPLY LINE

BACKGROUND OF THE INVENTION

1. Field of the Invention

This invention relates to an electro-luminescence display (ELD), and more particularly to an electro-luminescence display that is capable of widening an effective display area. Also, the present invention is directed to an ELD that is capable of assuring a sufficient storage capacitance of a capacitor.

2. Description of the Related Art

The ELD is a display device in which electrons and holes are injected from the exterior thereof to re-combine the electrons with the holes and thus produce excited molecules so as to exploit the luminescence of these excited molecules. Since the ELD does not require a backlight, a thin panel can be used and there is a relatively low power consumption. Accordingly, there is a growing interest in a display of this type for use in the future.

FIG. 1 is an equivalent circuit diagram of a unit cell in the conventional ELD. In FIG. 1, a gate line G crosses a data line D to define a pixel cell area. At the pixel cell area, a power supply line L is arranged in parallel to the data line D. The power supply line L may be arranged in parallel to the gate line G. The pixel cell area includes a switching device T1, a driving device T2, a storage capacitor C and an electro-luminescent (EL) diode EL. The switching device T1 has a gate connected to the gate line G, a source connected to the data line and a drain connected to the driving device T2. The drain of the driving device T2 is connected to an anode(+) of the EL diode EL while the source thereof is connected to the power supply line L. The storage capacitor C is connected between the gate of the driving device T2 and the power supply line L. A cathode(−) of the EL diode EL is connected to a common electrode terminal 10.

An operation of the ELD having the structure as described above will be described. If the gate line G connected to the switching device TI is selected by a gate driver (not shown) to be turned on, then a data signal from the data line D connected to the switching device T1 is stored in the storage capacitor C. When the switching device T1 is turned off, a voltage of the storage capacitor C is maintained until the gate line G is selected again. At this time, the storage capacitor C has a voltage applied to the gate of the driving device T2. Thus, a source current determined in accordance with a gate voltage of the driving device T2 arrives at the common electrode 10, via the driving device T2 and the EL diode EL, from the power supply line L. In this operational process, the EL diode EL becomes luminous. In this manner, the driving device T2 responds to a selecting signal applied to the gate line G and the data line D selectively to control a current flowing through the driving T2 from the power supply line L. The EL diode EL controls a magnitude of current with the aid of the driving device T2 and is luminous into a desired magnitude of brightness corresponding to the magnitude of current. For example, if a certain gate voltage is applied to the gate of the driving device T2, then the magnitude of a current passing through the driving device T2 is determined. Accordingly, the magnitude of a current flowing through the diode EL also is determined.

FIG. 2 is a plane view showing the structure of a conventional ELD. Referring to FIG. 2, a gate line 22 crosses a data line 21 to define one pixel cell area. A power supply line 25 is arranged in parallel to the data line 21. A switching device T1 is electrically connected to the data Line 21 and the gate line 22. The switching device T1 consists of an active layer 23, a gate electrode 22G superposed on the active layer 23, a source electrode 21S protruded from the data line 21 and a drain electrode 24 opposed to the source electrode 21S. A driving deviceT2 for driving an EL emitting part 28 is connected to the drain electrode 24 of the switching device T1. A driving device T2 consists of an active layer 27, a gate electrode 26G connected to the drain electrode 24 of the switching device T1, and a source electrode 25S protruded from the power supply line 25. A drain electrode 26D of the driving device T2 is electrically connected to the EL emitting part 28.

A storage capacitor Cap is provided within a pixel cell corresponding to a space between the driving device T2 and the power supply line 25. The storage capacitor Cap uses a portion of a wire connecting the source 25S of the driving device T2 to the power supply line 25 as an upper electrode 25C and uses a wire extended from the gate electrode 26G of the driving device T2 to be superposedwith the upper electrode 25C as a lower electrode 26C.

FIG. 3 and FIG. 4 are section views taken along "A—A" and "B—B" lines in FIG. 2, respectively. Referring to FIG. 3 and FIG. 4, the switching device T1 consists of a semiconductor layer 32, a gate insulating film 30, the gate electrode 22G, a film 36 for insulation between layers, the source electrode 21S and the drain electrode 24 which are formed on a substrate 40. The driving device T2 consists of a semiconductor layer 44, a gate insulating film 42, the gate electrode 26G, the film 36 for insulation between layers, the source electrode 25S and the drain electrode 26D which are formed on the substrate 40. The storage capacitor Cap consists of the lower electrode 26C extended from the gate electrode 26G of the driving device T2, and the upper electrode 25C extended from the source electrode 25S of the driving device T2. After the switching device T1, the driving device T2 and the storage capacitor Cap is formed, a protective film 60 is formed in such a manner to cover them. The protective film is provided with contact holes to electrically connect a transparent pixel electrode 70 to the drain electrode 26D of the driving device T2. The pixel electrode 70 is connected to the EL emitting part 28. In other words, the drain electrode 26D of the driving device T2 is electrically connected to the EL emitting part 28. The source electrodes 21S and 25S and the drain electrodes 24 and 26D are coupled with the semiconductor layers 32 and 44 through the contact holes provided within the film 36 for insulation between layers.

The conventional ELD configured as described above uses a wire protruded from the power supply line into the interior of the pixel cell with having a desired area. In such an LCD, an effective display area of the pixel cell is reduced in proportion to an area protruded from the power supply line. Particularly, since an area of the upper electrode must be enlarged so as to increase an accumulated capacitance of the storage capacitor, the effective display area of the pixel cell becomes smaller. Also, a thickness of the film for insulation between layers formed between the lower electrode and the upper electrode of the storage capacitor must be thinned in order to increase a capacitance of the storage capacitor. However, as a thickness of the film for insulation between layers becomes thinner, locations of the source and drain electrodes formed at the same layer as the upper electrode becomes closer to the substrate. In other words, a distance between the source and drain electrodes and the gate electrode is decreased in order to each other to increase a parasitic capacitance. To the contrary, if a thickness of the film for insulation between layers becomes larger to reduce a parasitic capacitance, then an accumulated capacitance of the storage capacitor is decreased so that it is impossible to accumulate the level of voltage required for a driving of the pixel cell.

SUMMARY OF THE INVENTION

Accordingly, it is an object of the present invention to provide an electro-luminescence display that is capable of widening an effective display area of a pixel.

A further object of the present invention is to provide an electro-luminescence display that is capable of assuring a sufficient storage capacitance of a capacitor.

In order to achieve these and other objects of the invention, an electro-luminescence display according to one aspect of the present invention includes a gate line; a data line formed in a direction crossing the gate line; a power supply line formed in a manner such that it is insulated from the gate line and the data line; a first switching device having a gate connected to the gate line and a source connected to the data line; a second switching device having a gate connected to a drain of the first switching device and a source connected to the power supply line; and electric emitting part connected to the drain of then second switching device; and a storage capacitor formed in a longitudinal direction of the power supply line to charge a voltage applied to the gate of the second switching device.

An electro-luminescence display according to another aspect of the present invention includes a gate line; a data line formed in a direction crossing the gate line; a power supply line formed in such a manner to be insulated from the gate line and the data line; a first switching device having a gate connected to the gate line and a source connected to the data line; a second switching device having a gate connected to a drain of the first switching device and a source connected to the power supply line; and a storage capacitor including an upper electrode and a lower electrode superposed with having a dielectric layer therebetween to charge a voltage applied to the gate of the second switching device, said upper electrode of the storage capacitor being formed on a dielectric layer different from the source and drain electrodes of the second switching device.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
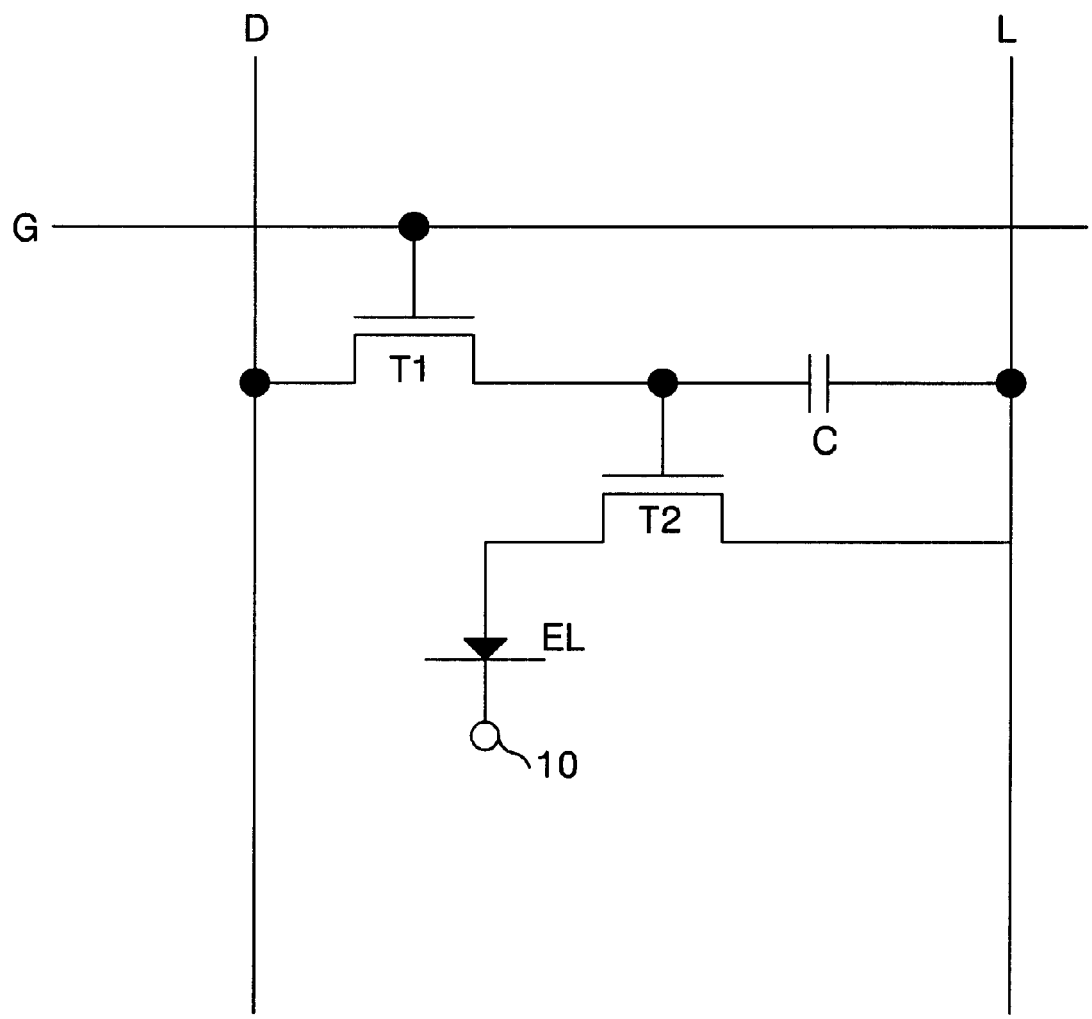
FIG. 1 is a schematic equivalent circuit diagram of a unit pixel cell in the conventional electro-luminescence display.
Figure 2:
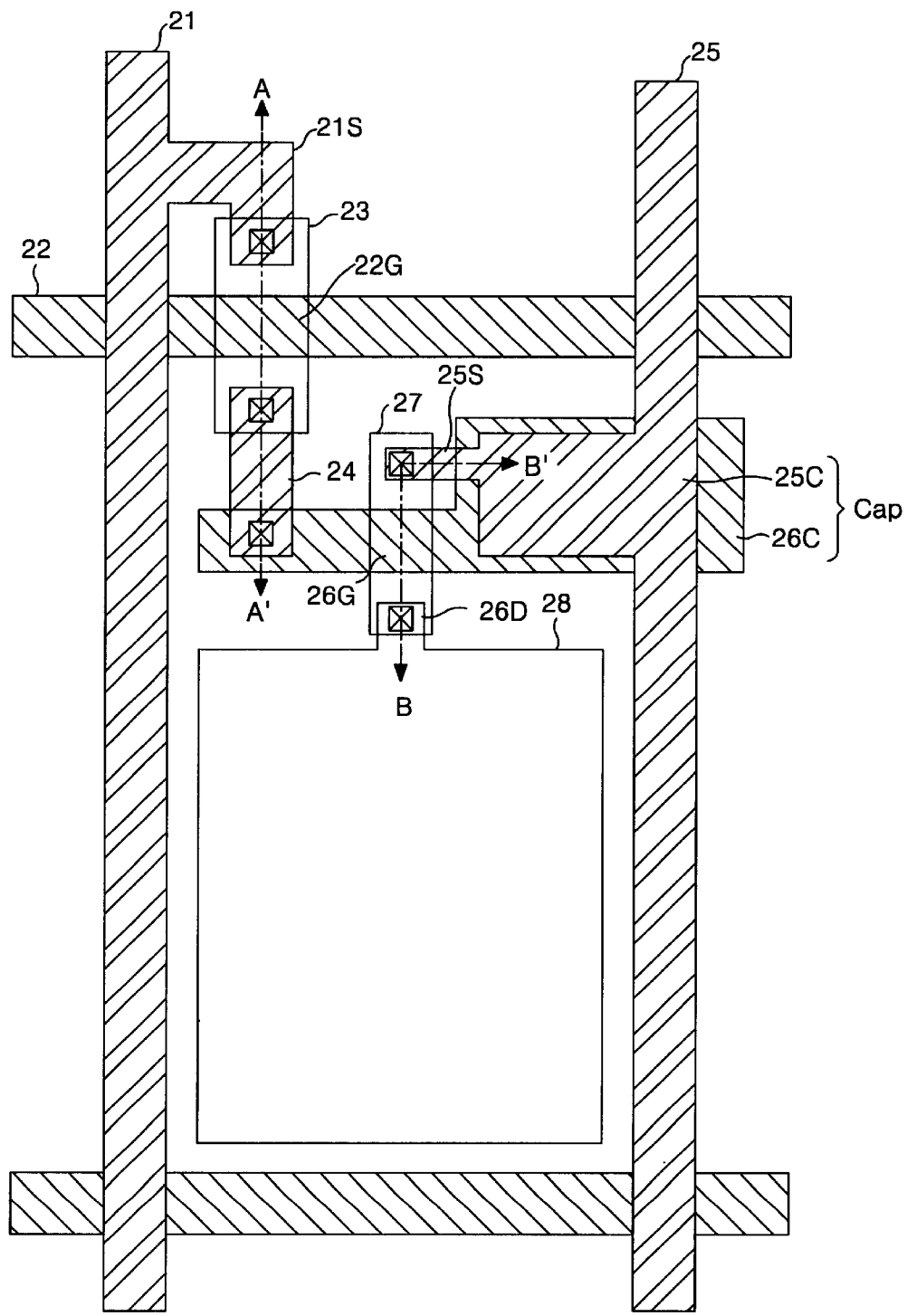
FIG. 2 is a plan view showing a structure of the conventional ELD.
Figure 3:
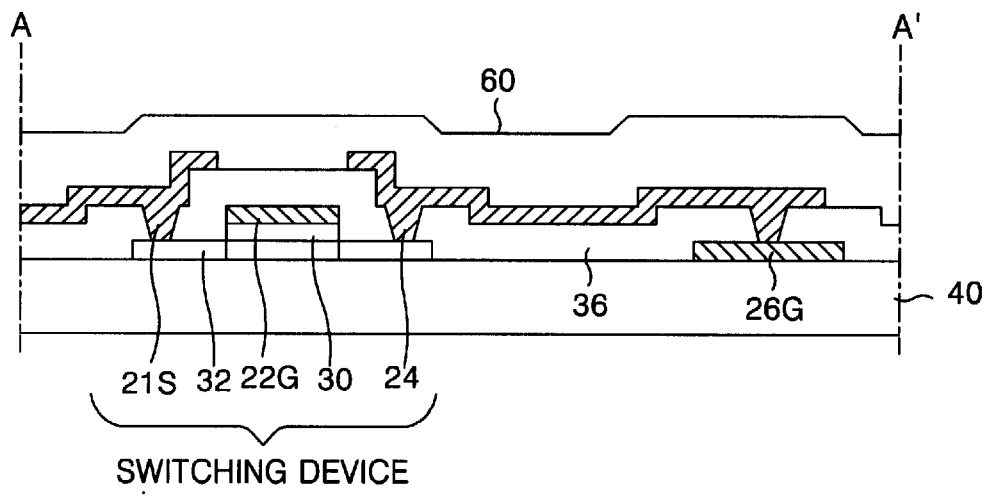
FIG. 3 is a section view taken along "A—A" line in FIG. 2.
Figure 4:
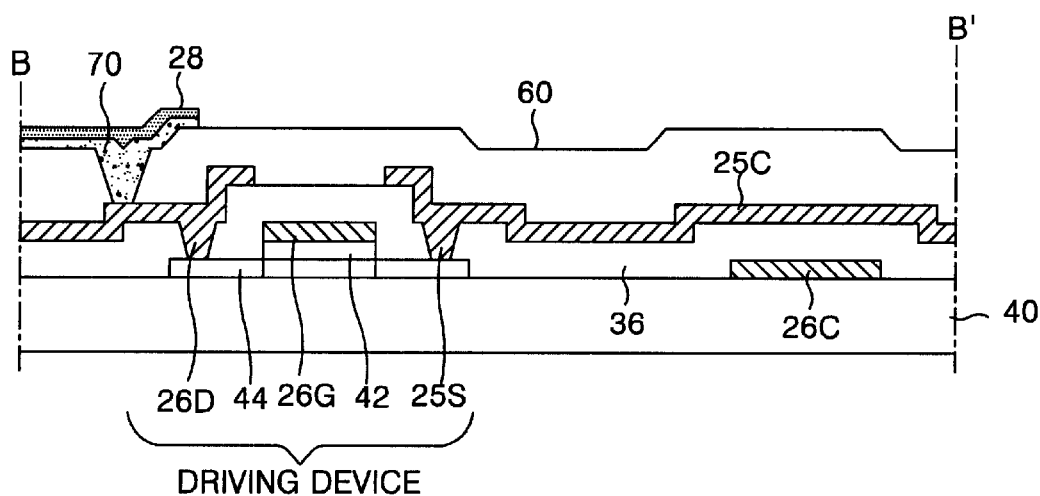
FIG. 4 is a section view taken along "B—B" line in FIG. 2.
Figure 5:
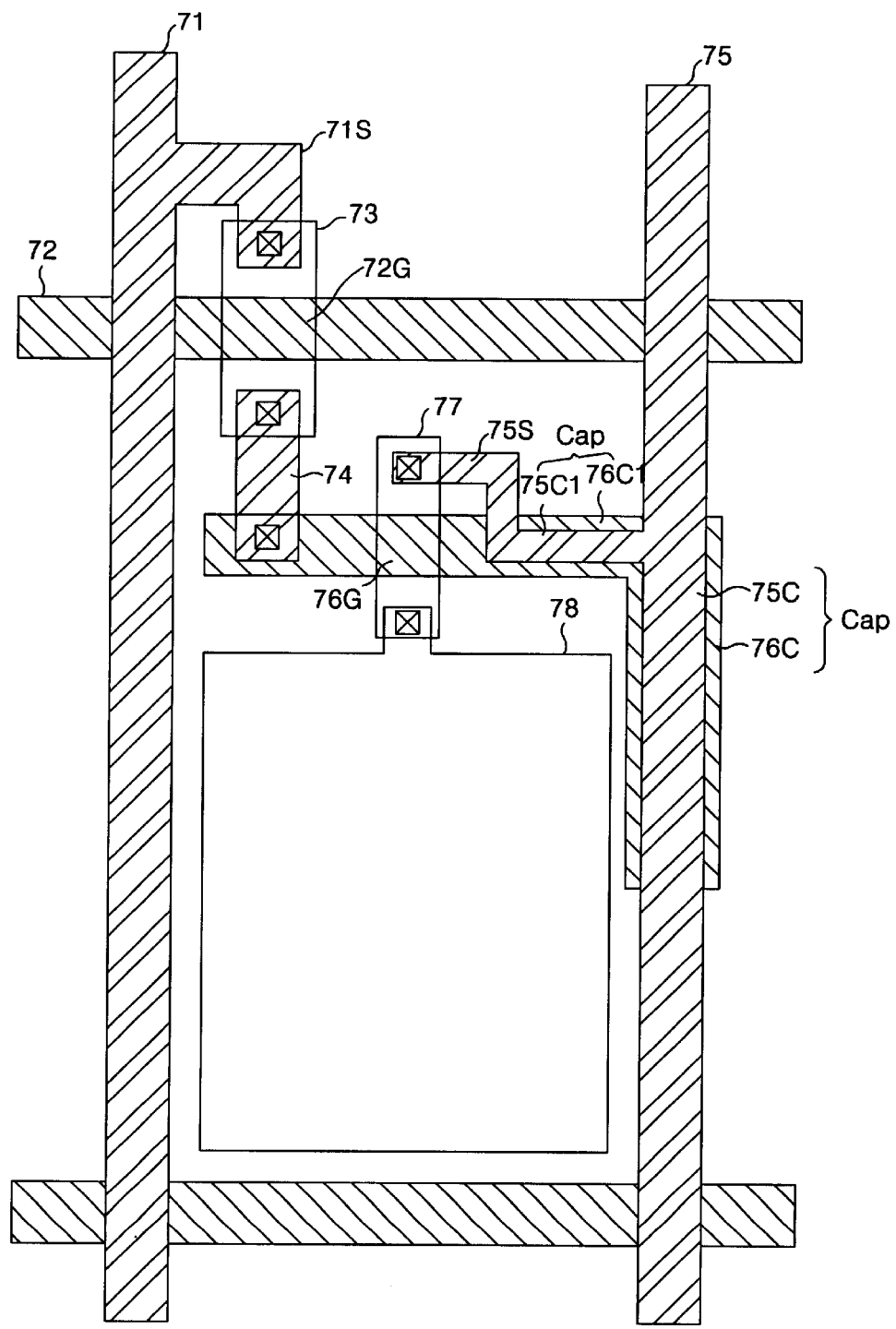
FIG. 5 is a plan view showing a structure of an ELD according to a first embodiment of the present invention.

Referring to FIG. 5, there is shown an electro-luminescence display (ELD) according to a first embodiment of the present invention. In the ELD, a gate line 72 crosses a data line 71 to define one pixel cell area. A power supply line 75 is arranged in parallel to the data line 71. The power supply line 75 has been arranged in parallel to the data line 71 in the first embodiment, but it may be formed into a desired pattern at a certain position of the pixel cell area depending on a design at the beginning of manufacturing. For instance, the power supply line 75 may be arranged in parallel with the gate line 72. A switching device located at an intersection between the gate line 72 and the data line 71 is electrically connected to the gate line 72 and the data line 71. The switching device consists of an active layer 73 defined as source and drain areas which are doped with an impurity and a channel area which is not doped with an impurity, a source electrode 71S protruded from the data line 71 to be connected to the source area of the active layer 73, a gate electrode 72G superposed on the channel area of the active layer 73 as a portion of the gate line 72, and a drain electrode 74 opposed to the source electrode 71S and connected to the drain area of the active layer 73. The drain electrode 74 of the switching device is connected to a driving device for driving an EL emitting part 78. The driving device consists of an active layer 77 defined as source and drain areas which are impurity doped areas and a channel area which is an impurity non-doped area, a gate electrode 76G connected to the drain electrode 74 of the switching device to be superposed on the active layer 77, and a source electrode 75S protruded from a power supply line 75 to be connected to the source area of the active layer 77. The drain area of the active layer 77 in the driving device is electrically connected to the EL emitting part 78.

A wire comprising the gate electrode 76G of the driving device extends to the power supply line 75, and beyond and down along the power supply line 75 in a manner such that it is superposed on the power supply line 75. In other words, a wire comprising the gate electrode 76G forms an electrode of a storage capacitor (Cap) along with the power supply line 75. The extending wire of the gate electrode 76G superposed on the power supply line 75 makes a lower electrode (first electrode) 76C of the storage capacitor Cap, whereas the power supply line superposed thereon comprises an upper electrode 75C (second electrode) of the storage capacitor Cap. As shown in the drawing, a wire part (75C1) acting as an electrode, connecting the power supply line 75 to the source electrode 75S of the driving device is patterned to be superposed on the gate electrode 76G also serving as an electrode (76C1) of the driving device so that it may be used as the storage capacitor Cap. Also, the lower electrode 76C of the storage capacitor Cap extended from the gate electrode 76G of the driving device is formed at an edge portion of the pixel cell so that it is possible to increase a capacitance of the storage capacitor Cap.

In other words, the first embodiment utilizes the patterning of each wire into various shapes in order to use the power supply line 75 as an electrode of storage capacitor Cap. When compared with the conventional ELD, the ELD according to the first embodiment of the present invention does not require an additional wire for forming the storage capacitor Cap. In other words, the storage capacitor Cap is formed in a manner such that it is superposed on the power supply line 75. Accordingly, a reduction of the effective display area generated due to the existence of the storage capacitor Cap in the interior of the pixel cell can be prevented.

In the first embodiment, the active layer 73 of the switching device and the active layer 77 of the driving device are formed of a semiconductor layer such as amorphous silicon, polycrystalline silicon or single-crystalline silicon. The source and drain areas formed within each active layer 73 and 77 are selectively doped with an n-type or p-type impurity. The electrodes and lines 71, 71S, 72G, 72, 74, 75S, 76G and 76C are formed by vapor deposition of a common metal material. A high conductivity semiconductor layer doped with an n-type or p-type impurity can be used as the wires forming the gate electrode 76G of the driving device and the lower electrode 76C of the storage capacitor.

Figure 6:
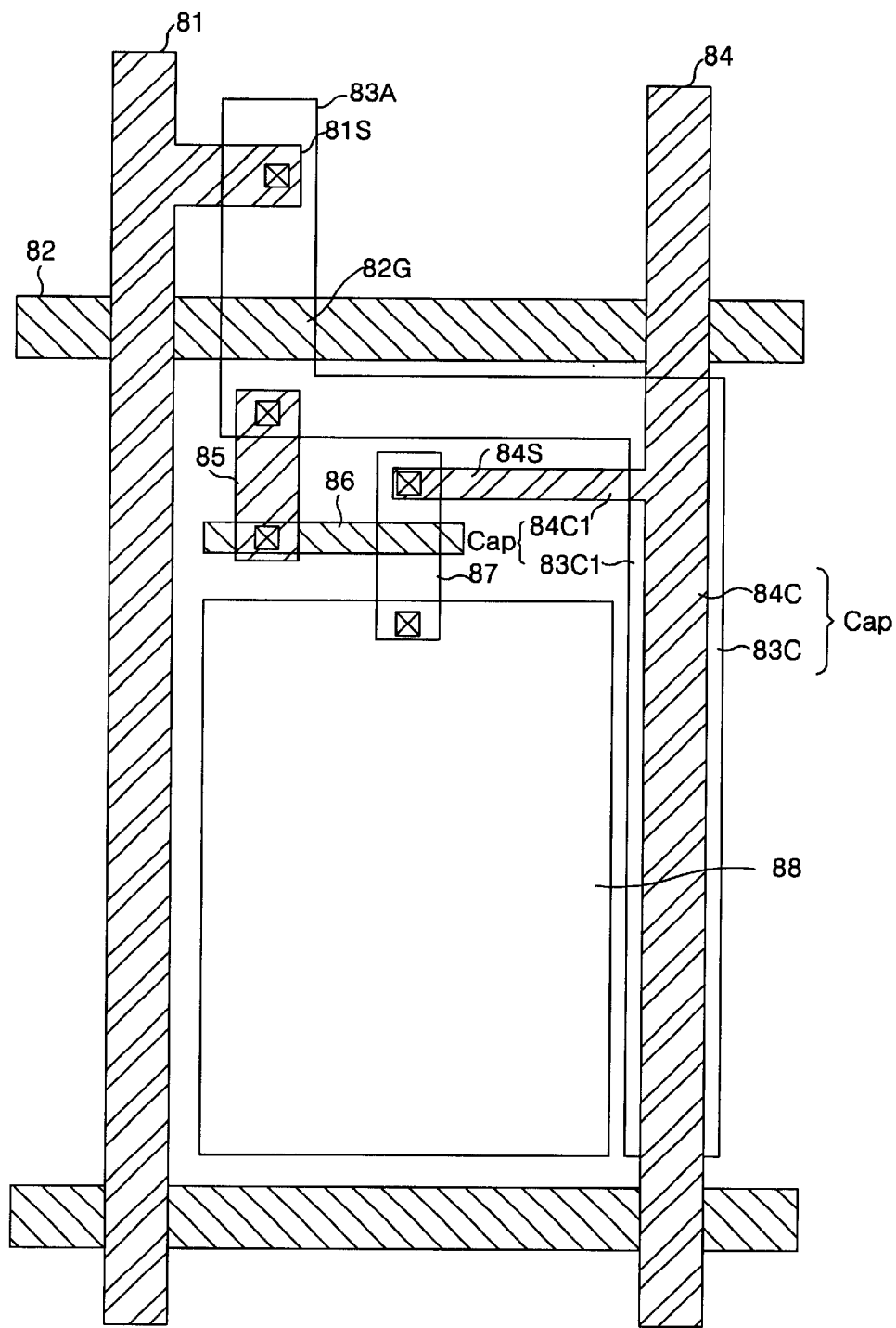
FIG. 6 is a plan view showing a structure of an ELD according to a second embodiment of the present invention.

Referring to FIG. 6, there is shown an electroluminescence display (ELD) according to a second embodiment of the present invention. In the ELD, a gate line 82 crosses a data line 81 to define one pixel cell area. A power supply line 84 is arranged in parallel with the data line 81. The power supply line 84 has been arranged in parallel with the data line 71 in the second embodiment, but it may be formed into a desired pattern at a certain position of the pixel cell area depending on an initial design of manufacturing. For instance, the power supply line 84 may be arranged in parallel to the gate line 82. A switching device located at an intersection between the gate line 82 and the data line 81 is electrically connected to the gate line 82 and the data line 81. The switching device consists of an active layer 83A defined as source and drain areas which are doped with an impurity and a channel area which is not doped with an impurity, a source electrode 81S protruded from the data line 81 to be connected to the source area of the active layer 83A, a gate electrode 82G superposed on the channel area of the active layer 83 as a portion of the gate line 82, and a drain electrode 85 opposite the source electrode 81S and connected to the drain area of the active layer 83A.

The active layer 83A of the switching device is formed of a semiconductor layer. The semiconductor layer provided with the active layer 83A extends to the power supply line 84, and extends over and down from a portion crossing the power supply line 84 in a manner such that it is superposed on the power supply line 84. In other words, the semiconductor layer comprising the active layer 83A forms an electrode of a storage capacitor Cap along with the power supply line 84. The semiconductor layer superposed on the power supply line 84 makes a lower electrode 83C of the storage capacitor Cap, whereas the power supply line superposed thereon makes an upper electrode 84C of the storage capacitor Cap. The semiconductor layer used as the active layer 83A of the switching device and the lower electrode 83C of the storage capacitor Cap is doped with an impurity at the entire portion thereof except for the channel area superposed on the gate electrode 82G of the switching device. Accordingly, the semiconductor layer has a high conductivity characteristic. Also, the lower electrode 83C of the storage capacitor Cap extended from the active layer 83A of the switching device is formed at an end part of the pixel cell so that it is possible to increase the capacitance of the storage capacitor Cap. In addition, a wire, also serving as an electrode (84C1), extended from the power supply line 84 to form the source electrode 84S of the driving device is patterned in a manner such that it is superposed on a wire, serving as electrode 83C1, extended from the active layer 83A of the switching device so that it can be used as a storage capacitor.

In other words, the second embodiment utilizes patterning of each wire into various shapes in order to use the power supply line 84 as an electrode of the storage capacitor Cap. When compared with the conventional ELD, the ELD according to the second embodiment of the present invention does not form the storage capacitor Cap with an additional wire at the interior of the pixel cell. In other words, the storage capacitor Cap is formed in a manner so that it is superposed on the power supply line 84. Accordingly, a reduction of the effective display area generated due to the existence of the storage capacitor Cap in the interior of the pixel cell can be prevented. In the second embodiment, the drain electrode 85 of the switching device is connected to a driving device for driving an EL emitting part 88. The driving device consists of an active layer 87 having source and drain areas which are impurity doped areas and a channel area which is an impurity non-doped area, a gate electrode 86 connected to the drain electrode 85 to be superposed on the channel area of the active layer 87, and a source electrode 84S protruded from the power supply line 84 to be connected to the source area of the active layer 87. The drain area of the active layer 87 is electrically connected to the EL emitting part 88. The active layer 83A of the switching device and the active layer 87 are formed of a semiconductor layer such as amorphous silicon, polycrystalline silicon or single-crystalline silicon. The electrodes 81S, 82G, 84S, 85 and 84C and the wires 81, 82 and 84 included in the second embodiment are formed by vapor deposition of a common metal material.

Figure 7:
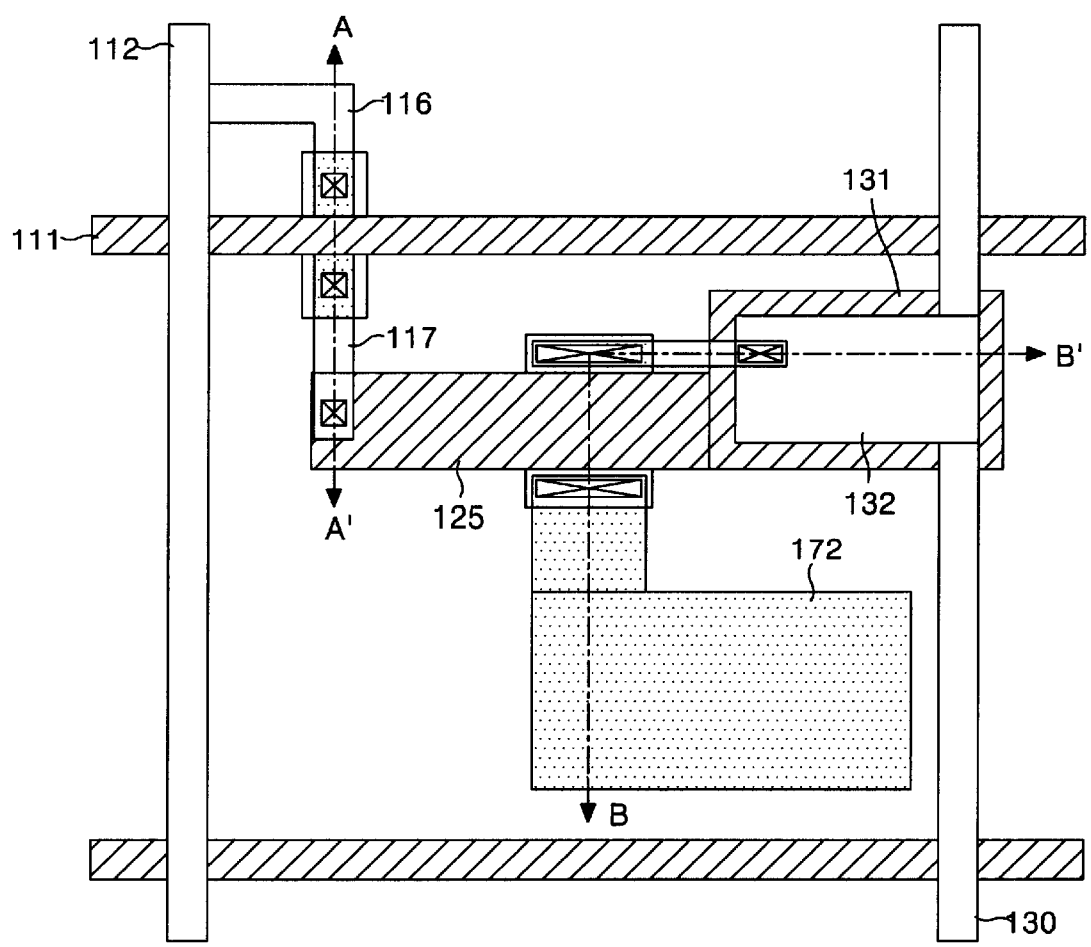
FIG. 7 is a plan view showing a structure of an ELD according to a third embodiment of the present invention.
Figure 8:
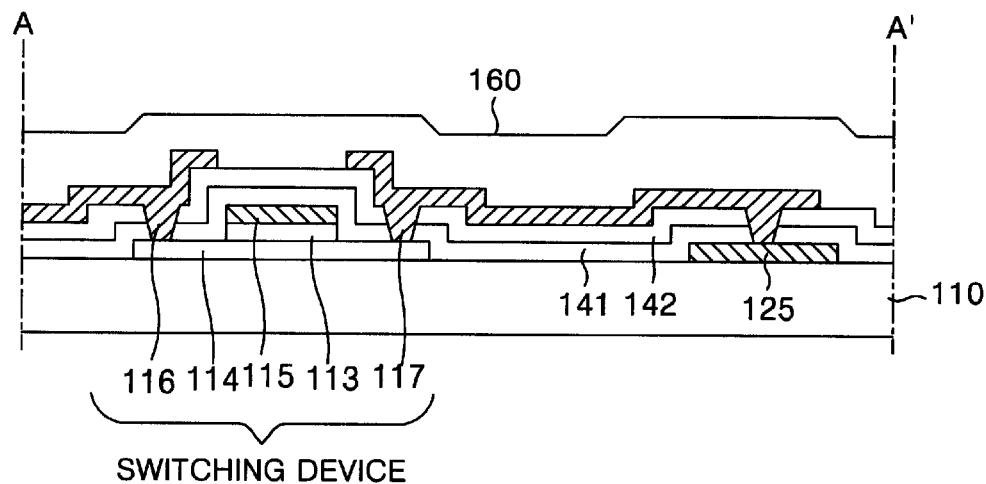
FIG. 8 is a section view taken along "A—A" line in FIG. 7.
Figure 9:
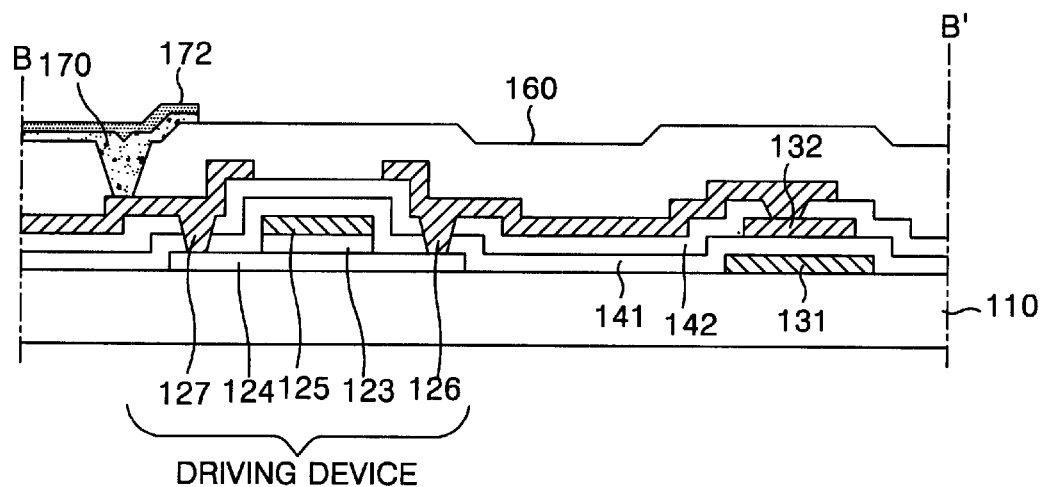
FIG. 9 is a section view taken along "B—B" line in FIG. 7.

FIG. 7 is a plan view showing a structure of an ELD according to a third embodiment of the present invention and FIG. 8 and FIG. 9 are section views taken along lines "A—A" and "B—B" in FIG. 7, respectively. Referring now to FIG. 7 through FIG. 9, the pixel electrode structure of the ELD according to the third embodiment includes a substrate 110 (See FIG. 8), a gate line 111 and a data line 112 formed on the substrate 110 to divide the substrate 110 into a plurality of pixel areas, a switching device formed for each pixel area and consisting of a gate insulating film 113, a semiconductor layer 114, a gate electrode 115, a source electrode 116 and a drain electrode 117, a driving device formed for each pixel area and consisting of a gate insulating film 123, a semiconductor layer 124, a gate electrode 125, a source electrode 126 and a drain electrode 127, a first film 141 for insulation between layers formed on the gate electrode 115 and 125, a power supply line 130 and an upper electrode 132 of a storage capacitor formed on the first film 141 for insulation between layers, a second film 142 for insulation between layers formed on the first film 141 for insulation between layers, the power supply line 130 and the upper electrode 132, a protective film 160 formed to cover all of the above-mentioned elements, a transparent pixel electrode 170 connected, via contact holes of the protective film 160, to the drain electrode 127 of the driving device, and an EL emitting part 172 electrically connected to the pixel electrode 170. The source electrodes 116 and 126 and the drain electrodes 117 and 127 are connected, via the contact holes in the first and second films 141 and 142 for insulation between layers, to the semiconductors 114 and 124.

When compared with the prior art, the third embodiment has the source and drain electrodes 116, 126, 117 and 127, the power supply line 130 and the upper electrode 132 of the storage capacitor formed at a different layer. In other words, the source and drain electrodes 116, 126, 117 and 127 are formed on the first and second films 141 and 142 for insulation between layers, whereas the power supply line 130 and the upper electrode 132 of the storage capacitor are formed on the first film 141 for insulation between layers. Thus, a distance between the source and drain electrodes 116, 126, 117 and 127 and the gate electrodes 115 and 125 are increased to reduce parasitic capacitance generated between the source and drain electrodes 116, 126, 117 and 127 and the gate electrodes 115 and 125. Also, a distance between the upper electrode 132 and the lower electrode 131 of the storage capacitor is reduced to increase storing capacity of the storage capacitor. In addition, since the source and drain electrodes 116, 126, 117 and 127 and the power supply line 130 is formed at a different layer, a possibility of a short that may be generated in the course of processing is reduced. The third embodiment of the present invention having as described above is applicable to the first and second embodiment of the present invention.

The elements of the present invention will be described in detail below. The substrate 110 is made from a glass and a plastic, etc. The semiconductor layers 114 and 124 are formed by coating a polycrystalline silicon film on the substrate 110 and thereafter patterning it by photolithography. The gate insulating films 113 and 123 and the gate electrodes 115 and 125 are formed by continuously depositing an insulating material of $SiN_x$ or $SiO_x$, etc. and a conductive material of Al, etc. and thereafter patterning it by photolithography to leave only a portion corresponding to the channel areas of the semiconductor layers 114 and 124. In this process, the gate electrodes 115 and 125, the gate wire 111 and the lower electrode 131 are provided. Thereafter, an insulating material such as $SiN_x$ or $SiO_x$, etc. is deposited to form the first film 141 for insulation between layers. At this time, the first film 141 for insulation between layers is formed into a thickness as small as possible so that it can reduce a distance between the lower electrode 131 and the upper electrode 132 of the storage capacitor. After the first film 141 for insulation between layers are provided, a conductive material such as Al, etc. is deposited. The conductive material is then patterned by photolithography to form the power supply line 130 and the upper electrode 132 of the storage capacitor. Thereafter, an insulating material such as $SiN_x$ or $SiO_x$, etc. is deposited to form the second film 142 for insulation between layers. The second film 142 for insulation between layers is provided by depositing at least one layer of insulating film. After the second film 142 for insulation between layers is formed, contact holes are formed within the first and second films 114 and 124 for insulation between layers. The contact holes are defined at an area provided with the source and drain areas of the semiconductor layers 114 and 124 and the gate electrode 125 of the driving device. The source electrodes 116 and 126 and the drain electrodes 117 and 127 are connected, via the contact holes formed in the source and drain areas of the semiconductor layers 114 and 124, to the semiconductor layers 114 and 124. The drain electrode 117 of the switching device is connected, via the contact hole formed in an area provided with the gate electrode 125, to the gate electrode 125. Also, a contact hole is formed in the second film 142 for insulation between layers so that the upper electrode 132 of the storage capacitor may be connected to the source electrode 126 of the switching device. The source electrodes 116 and 126, the drain electrodes 117 and 127 and the data line 112 formed on the second film 42 for insulation between layers are provided by depositing a conductive material such as $SiN_x$ or $SiO_x$, etc, and thereafter patterning it by photolithography. Then, an organic insulating film such as $SiN_x$, $SiO_x$ or Benzo-Cyclo-Butene (BCB) etc. is entirely coated to form a protective film 160. The protective film 160 is provided with a contact hole so that the drain electrode 127 of the driving device may be connected to transparent pixel electrode 170. A transparent conductive material such as Indium-Tin-Oxide is coated on the protective film 160 and is then patterned by photolithography to form the pixel electrode 170. The pixel electrode 170 is electrically connected to the EL emitting part 172. A reflective electrode (not shown) as a counter electrode of the pixel electrode is formed on the pixel electrode 170.

In the third embodiment of the present invention, the lower electrode 131 of the storage capacitor is integral to the gate electrode 125 of the driving device. However, if the lower electrode 131 of the storage capacitor can be electrically connected to the gate electrode 125, then the lower electrode 131 of the storage capacitor may be formed at a layer different from the gate electrode 125 of the driving device. For example, the lower electrode 131 of the storage capacitor may be provided by coating a polycrystalline silicon film on an area provided with the upper electrode 131 of the storage capacitor when the semiconductor layers 114 and 124 are formed.

As described above, according to the present invention, the storage capacitor is not provided by forming a separate wire at the interior of the pixel cell, but the power supply line patterned into a line shape is used as the electrode of the storage capacitor. Accordingly, a reduction in the effective display area of the pixel cell occurring due to the location of the storage capacitor can be prevented. Also, the wire superimposed on the power supply line to form the storage capacitor is extended into the lower end of the pixel cell so that it is possible to increase a storing capacity of the storage capacitor. In other words, the storing capacity can be increased within a reduction of the effective display area. Furthermore, according to the present invention, the source and drain electrodes and the upper electrode of the storage capacitor are provided at a layer different from each other. In other words, the source and drain electrodes are formed at a high layer than the upper electrode of the storage capacitor. Accordingly, it becomes possible to minimize parasitic capacitance generated between the source and drain electrodes and the gate electrodes as well as increase the storing capacity of the storage capacitor.

Although the present invention has been explained by the embodiments shown in the drawings described above, it should be understood by the ordinary skilled person in the art that the invention is not limited to the embodiments, but rather than various changes or modifications thereof are possible without departing from the spirit of the invention. Accordingly, the scope of the invention shall be determined only by the appended claims and their equivalents.

What is claimed is:

1. An electro-luminescence display, comprising:
   a gate line;
   a data line formed in a direction crossing the gate line;
   a power supply line formed in such a manner to be insulated from the gate line and the data line;
   a first switching device having a gate connected to the gate line and a source connected to the data line;
   a second switching device having a gate connected to a drain of the first switching device and a source connected to the power supply line;
   an electro-luminescent part connected to the drain of the second switching device; and a storage capacitor formed in a lengthwise direction of the power supply line to charge a voltage applied to the gate of the second switching device.

2. The electro-luminescence display according to claim 1, wherein the storage capacitor includes:
   a first electrode formed in a lengthwise direction of the power supply line; and
   a second electrode patterned to be superposed on the first electrode and having a dielectric layer therebetween.

3. The electro-luminescence display according to claim 2, wherein the storage capacitor further includes:
   a third electrode formed in a lengthwise direction and also comprising the gate electrode of the second switching device and connected to the first electrode; and
   a fourth electrode also comprising the source electrode of the second switching device, superposed on the third electrode, and having a dielectric layer therebetween, said fourth electrode being connected to the second electrode.

4. The electro-luminescence display according to claim 3, wherein the gate of the second switching device and the first and third electrodes are made from the same wire material.

5. The electro-luminescence display according to claim 2, wherein the storage capacitor further includes:
   a third electrode extended from an active layer of the first switching device to be connected to the first electrode; and
   a fourth electrode superposed on a portion of the third electrode, and having a dielectric layer therebetween to be connected to the second electrode, said fourth electrode comprising a portion of the power supply line.

6. The electro-luminescence display according to claim 5, wherein the active layer of the first switching device and the first and third electrodes are made from the same wire material.

7. The electro-luminescence display according to claim 5, wherein the first and third electrodes are semiconductor layers doped with an impurity.

8. An electro-luminescence display, comprising:
   a gate line;
   a data line formed in a direction crossing the gate line;
   a power supply line formed in such a manner to be insulated from the gate line and the data line;
   a first switching device having a gate connected to the gate line and a source connected to the data line;
   a second switching device having a gate connected to a drain of the first switching device and a source connected to the power supply line; and
   a storage capacitor including an upper electrode and a lower electrode superposed upon it, having a dielectric layer therebetween to charge a voltage applied to the gate of the second switching device, said upper electrode of the storage capacitor being formed on a dielectric layer different from the dielectric layer that the source and drain electrodes of the second switching device are formed on.

9. The electro-luminescence display according to claim 8, wherein the first and second switching devices include:
   a substrate;
   a semiconductor layer formed on the substrate;
   a gate insulating film formed on the semiconductor substrate;
   at least one first film for insulation between layers, formed on the gate electrode;
   at least one second film for insulation between layers, formed on the first film; and
   gate and source electrodes, the source electrode being provided on the second film for insulation between layers.

10. The electro-luminescence display according to claim 9, wherein the upper electrode of the storage capacitor is provided between the first and second films for insulation between layers.

11. The electro-luminescence display according to claim 10, wherein the upper electrode of the storage capacitor is electrically connected, via a contact hole formed in the second film for insulation between layers, to the source electrode of the second switching device.

12. The electro-luminescence display according to claim 8, wherein the power supply line and the upper electrode of the storage capacitor are formed at the same layer.

13. The electro-luminescence display according to claim 9, further comprising:
   a protective film entirely coated on the substrate; and
   a transparent electrode provided on the protective film and connected, via a contact hole formed in the protective film, to any one of the source and drain electrodes of the second switching device.

14. The electro-luminescence display according to claim 8, wherein the lower electrode of the storage capacitor is formed from an extended portion of the gate electrode of the second switching device.

15. The electro-luminescence display according to claim 8, wherein the Lower electrode of the storage capacitor is formed of a polycrystalline silicon film.

* * * * *